(12) United States Patent
Shimada

(10) Patent No.: US 7,324,373 B2
(45) Date of Patent: Jan. 29, 2008

(54) SEMICONDUCTOR DEVICE AND SHORT CIRCUIT DETECTING METHOD

(75) Inventor: Akihiro Shimada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 11/259,141

(22) Filed: Oct. 27, 2005

(65) Prior Publication Data
US 2007/0019456 A1   Jan. 25, 2007

(30) Foreign Application Priority Data
Jul. 19, 2005   (JP) .............................. 2005-208923

(51) Int. Cl.
*G11C 11/34* (2006.01)
(52) U.S. Cl. ........................................ 365/174; 365/63
(58) Field of Classification Search ................ 365/174, 365/63; 257/786
See application file for complete search history.

(56) References Cited

U.S. PATENT DOCUMENTS 6,555,922 B1 *   4/2003   Nakagawa .................. 257/786

OTHER PUBLICATIONS

Patent Abstract of Japan, publication No. 2001305194, dated Oct. 31, 2001.
Patent Abstract of Japan, publication No. 2002203882, dated Jul. 19, 2002.

* cited by examiner

*Primary Examiner*—Anh Phung
(74) *Attorney, Agent, or Firm*—Westerman, Hattori, Daniels & Adrian, LLP.

(57) ABSTRACT

A short circuit detection region includes an insulating film, plural first conductor traces and plural second conductor traces which are embedded in the insulating film with only their surfaces being exposed, and the first conductor trace is constructed by integrally forming a band-shaped portion and plural via portions which are electrically connected to a silicon semiconductor substrate.

21 Claims, 14 Drawing Sheets

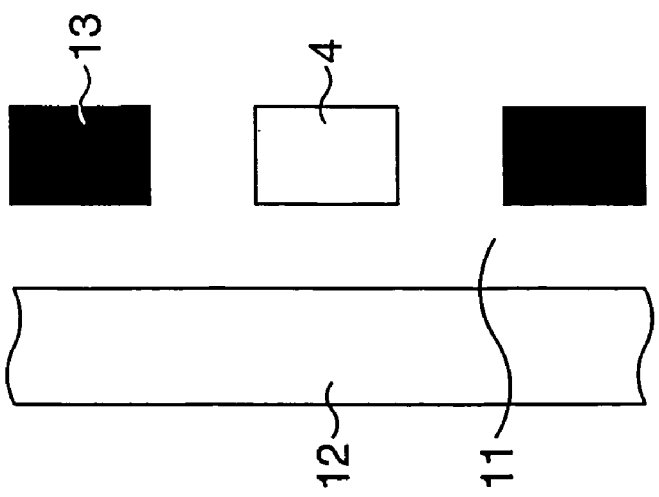
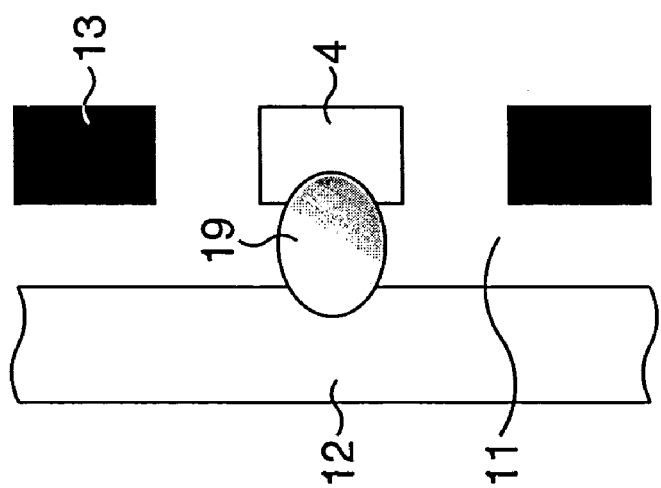
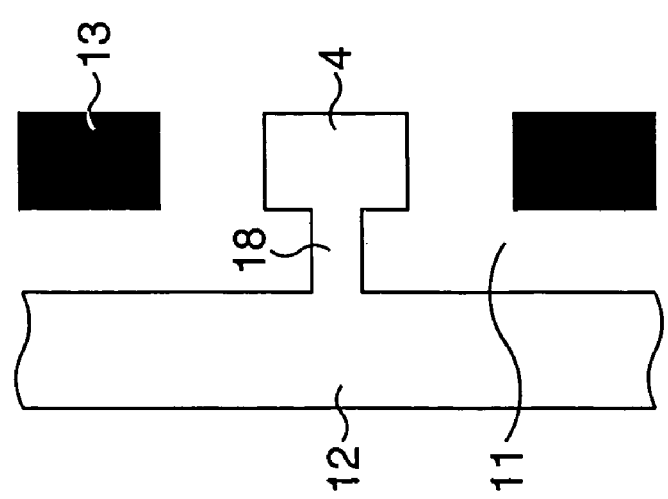

SEMICONDUCTOR DEVICE AND SHORT CIRCUIT DETECTING METHOD

CROSS-REFERENCE TO RELATED APPLICATIONS

This application is based upon and claims the benefit of priority from the prior Japanese Patent Application No. 2005-208923, filed on Jul. 19, 2005, the entire contents of which are incorporated herein by reference.

BACKGROUND OF THE INVENTION

1. Field of the Invention

The present invention relates to a short circuit detecting method for detecting a short circuit condition of wirings or the like on a semiconductor substrate and a semiconductor device used for short circuit detection.

2. Description of the Related Art

In a semiconductor device, an electrical short circuit in a wiring or a conductor becomes a fatal defect and reduces the yield of the semiconductor device. For example, a short circuit defect is caused because a conductive foreign object adheres onto a wiring and extends to a wiring adjacent thereto. In detecting such a short circuit defect, inspection is performed using a defect inspector, and then confirmation is made by review with a review system, for example, including an SEM. Similarly, a short circuit caused by a pattern failure between wirings is also confirmed by inspection and review. The presence or absence of these defects can be easily judged by observation from above with the SEM at the time of the review.

(Patent Document 1)
Japanese Patent Application Laid-open No. 2001-305194
(Patent Document 2)
Japanese Patent Application Laid-open No. 2002-203882

However, with the scale down and high-density integration of semiconductor elements in recent times, a so-called coating-type low dielectric constant interlayer insulating film comes to be used as a material for an insulating film between wirings. In the case of the coating-type one, unlike an interlayer insulating film formed by a CVD method or the like, a conductive foreign object is sometimes mixed into the interlayer insulating film when the interlayer insulating film is applied, and this foreign object causes a short circuit defect between the wirings. In this case, since the foreign object exists in the film, defect coordinates cannot be detected by ordinary defect inspection, or even if the defect coordinates are detected by allowing a detection beam of the defect inspection to pass through the film, a distinct image of the foreign object cannot be confirmed by the observation with the SEM at the time of review, whereby it is difficult to detect the short circuit in the film as a short circuit defect. Also in product defect inspection performed in a factory process, such a short circuit defect in the interlayer insulating film cannot be detected.

For example, as a detecting method of a short circuit defect position in the interlayer insulating film, a technique in Patent Document 1 is cited. As in Patent Document 1, there is disclosed a semiconductor device for inspection in which pairs of rectangular conductor traces are arranged in a staggered format, one of each pair being electrically connected to a semiconductor substrate and the other being electrically insulated therefrom. However, in this case, the number of connecting portions between one conductor trace and the semiconductor substrate is small (one in the example shown), whereby when a connection failure occurs between the one conductor trace and the semiconductor substrate, there is a problem that this connection failure is detected as an electric defect and becomes noise in short circuit detection, which significantly reduces the accuracy of the short circuit defect detection.

SUMMARY OF THE INVENTION

The present invention is made in view of the aforementioned problem and its object is to provide a short circuit detecting method and a semiconductor device which are capable of precisely and certainly detecting not only short circuit defects observable on the insulating film but also short circuit defects unobservable or hard to observe in the insulating film as distinguished from the short circuit defects on the insulating film and efficiently managing a semiconductor manufacturing process using information on the detected various kinds of short circuit defects.

A semiconductor device comprises: a semiconductor substrate; and a short circuit detection region provided on the semiconductor substrate to detect a short circuit condition on the semiconductor substrate, wherein the short circuit detection region comprises: an insulating film formed on the semiconductor substrate; a first conductor trace formed of a conductive material and embedded in the insulating film with its upper surface being exposed in such a manner as to be electrically connected to the semiconductor substrate by a plurality of connecting portions; and a plurality of second conductor traces formed of the conductive material and embedded in the insulating film with their upper surfaces being exposed in such a manner as to be close to the first conductor trace and electrically insulated from the semiconductor substrate.

A short circuit detecting method of the present invention comprises the steps of, when a short circuit condition is detected with a short circuit detection region in a state where on a semiconductor substrate, the short circuit detection region including an insulating film, a first conductor trace formed of a conductive material and embedded in the insulating film with its upper surface being exposed in such a manner as to be electrically connected to the semiconductor substrate by a plurality of connecting portions, and a plurality of second conductor traces formed of the conductive material and embedded in the insulating film with their upper surfaces being exposed in such a manner as to be close to the first conductor trace and electrically insulated from the semiconductor substrate is formed: measuring potentials of the respective second conductor traces; and providing optical images or SEM images of the second conductor traces whose potentials have changed in the short circuit detection region.

BRIEF DESCRIPTION OF THE DRAWINGS

FIG. 3A and FIGS. 3B-1 and 3B-2 are schematic sectional views showing a forming method of the short circuit detection region of the semiconductor device according to the first embodiment step by step;

FIGS. 4A-1 and 4A-2 and FIGS. 4B-1 and 4B-2 are schematic sectional views subsequent to FIGS. 3B-1 and 3B-2, showing the forming method of the short circuit detection region step by step;

FIG. 6A to FIG. 6C are plan views showing concrete short circuit states in various short circuit conditions observed by an SEM;

FIG. 9A and FIGS. 9B-1 and 9B-2 are schematic sectional views subsequent to FIG. 8D, showing the forming method of the short circuit detection region according to the modified example 1 of the first embodiment step by step;

FIGS. 10A-1 and 10A-2 and FIGS. 10B-1 and 10B-2 are schematic sectional views subsequent to FIGS. 9B-1 and 9B-2, showing the forming method of the short circuit detection region according to the modified example 1 of the first embodiment step by step;

DETAILED DESCRIPTION OF THE PREFERRED EMBODIMENTS

Basic Gist of the Present Invention

Figure 1:
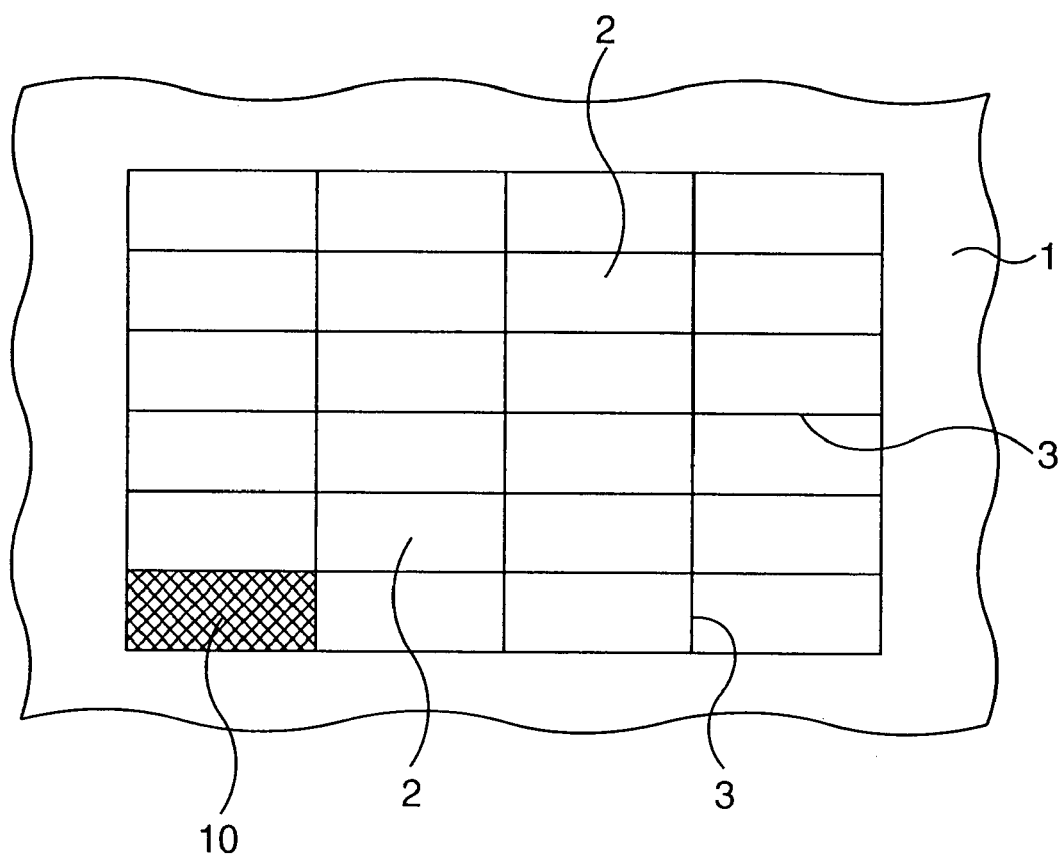
FIG. 1 is a plan view schematically showing a main constituent portion of a semiconductor device according to a first embodiment.

The present invention is suitably applied to a coating-type low dielectric constant insulating film, out of insulating films, into which a foreign object tends to be mixed especially when the film is formed.

In the present invention, first, to realize detection of short circuit defects occurring due to a conductive foreign object mixed into an insulating film in distinction from short circuit defects on the insulating film, together with the short circuit defects on the insulating film, a circuit detection region is formed by embedding a first conductor trace electrically connected to a semiconductor substrate and a second conductor trance electrically insulated from the semiconductor substrate in the insulating film in such a manner that their respective upper surfaces are exposed.

As defects unobservable or hard to observe in the insulating film, a short circuit defect in the insulating film between the first conductor trace and the second conductor trace and a defect caused by a failure of the connection between the first conductor trace and the semiconductor substrate are conceivable. When the latter defect occurs, the first conductor trace is brought into an insulating state and comes to have the same potential as the second conductor trace, so that a function of identifying a short circuit in the second conductor trace is lost. Accordingly, the latter defect becomes noise when the former defect, that is, the short circuit defect in the insulating film is detected. In the present invention, to prevent the occurrence of the latter defect, remove noise as much as possible, and improve the detection accuracy of short circuit defects in the insulating film, plural connecting portions are provided between the first conductor trace and the semiconductor substrate. Therefore, it is necessary to form the first conductor trace in such a shape that the plural connecting portions can be provided.

In this case, the plural connecting portions need to be properly dispersed in position from the perspective that an influence of a connection failure occurring locally in some connecting portion on the other connecting portions should be reduced as much as possible. Hence, it is the most desirable to form the plural connecting portions of the first conductor trace almost evenly throughout the first conductor trace.

As for a specific structure of the short circuit detection region, the first conductor trace is formed in a stripe shape, and the second conductor trace is formed in a strip shape such as a rectangle. Plural first conductor traces are formed in parallel to one another, and plural second conductor traces are formed between the adjacent first conductor traces along a longitudinal direction of the first conductor trace. In this case, it is desirable to make the distance between the adjacent first conductor traces as short as possible as long as technology and design constraints permit, and form the respective second conductor traces as small and as high-density as possible similarly as long as technology and design constraints permit. The larger the number of the formed first and second conductor traces, the more accurately the position of occurrence of a short circuit defect can be specified.

To detect a short circuit defect using the aforementioned short circuit detection region, first, by a defect inspector (for example, an SEM defect inspector) utilizing a so-called potential contrast method (See Patent Document 2), coordinates of the second conductor trace, out of the second conductor traces, whose potential has changed from a value corresponding to the insulating state are found. Since the second conductor trace is small, the short-circuit defect exists near the second conductor trace whose potential has changed.

Then, regarding the short circuit defect thus detected, whether the aforementioned short circuit defect exists on the insulating film or in the insulating film is specified by visual recognition or the like by observation with a microscope, for example, by an SEM. If the short circuit defect is not confirmed by visual recognition or the like using the SEM, this short circuit defect can be regarded as existing in the insulating film. Incidentally, a method for specifying concrete short circuit states in various short circuit conditions will be described later.

When a connection failure occurs in the connecting portion formed between the first conductor trace and the semiconductor substrate, this connecting portion cannot provide continuity between the first conductor trace and the semiconductor substrate. In the present invention, however, plural connecting portions which connect the first conductor trace and the semiconductor substrate are provided, and therefore even if the connection failure occurs in part of them, the continuity between the first conductor trace and the semiconductor substrate is maintained by the other connecting portions. The larger the number of connecting portions formed in one first conductor trace, the higher the probability that the continuity between the first conductor trace and the semiconductor substrate can be maintained becomes. Accordingly, in the present invention, it is possible to reduce noise in the detection of short circuit defects in the insulating film caused by the connection failure of the connecting portions as much as possible, and greatly increase the detection accuracy of short circuit defects in the insulating film.

As another example of the short circuit detection region, the first conductor traces may be formed in a net shape, and the second conductor trace may be disposed in each of meshes of the net-shaped conductor traces. This structure makes it possible that the number of connecting portions of the first conductor trace is markedly increased, and that even if disconnection occurs in two ore more portions of the first conductor trace together with the connection failure, the probability of occurrence of which is extremely low, short circuit defects in the insulating film are detected without the detection accuracy being lowered.

As concrete cases of the application of the short circuit detection region, a case where the short circuit detection region is locally formed together with a semiconductor element formation region on the semiconductor substrate and a case where the short circuit detection region is formed over almost the entire surface of the semiconductor substrate are conceivable.

When the short circuit detection region is locally formed together with the semiconductor element (such as an MOS transistor and various kinds of semiconductor memories) formation region on the semiconductor substrate as in the former case, the short circuit detection region is provided in one of plural semiconductor chip regions (regions which become individual semiconductor chips by being cut along scribe lines) or in a part of one semiconductor chip region. At this time, when the insulating film is formed in the semiconductor elements, the insulating film is also formed in the short circuit detection region at the same time, and short circuit detects of this insulating film (short circuit defects on the insulating film and in the insulating film) are detected. For example, based on the area ratio between the short circuit detection region and the semiconductor element formation region, the number of short circuit defects in the semiconductor element formation region on the semiconductor substrate can be estimated from the number of detected short circuit defects in the short circuit detection region.

Since, in the semiconductor element formation region, usually, in order to form various kinds of wiring structures in multiple layers, interlayer insulating films are formed, for example, in respective wiring layers while being stacked. Hence, corresponding to each of the interlayer insulating films, it is also possible that every time the interlayer insulating film is formed, a new short circuit detection region is formed while being stacked on the short circuit detection region whose short circuit detection is already completed, and that short circuit defects are estimated in each of the interlayer insulating films.

On the other hand, when the short circuit detection region is formed over almost the entire surface of the semiconductor substrate as in the latter case, the result of detection of short circuit defects of the insulating film on the semiconductor substrate can be used for process management. Namely, by detecting short circuit defects of the insulating film on the semiconductor substrate, short circuit defects of the insulating film on the semiconductor substrate before and after this semiconductor substrate or in a lot including this semiconductor substrate can be estimated. By forming such a semiconductor substrate at predetermined intervals, for example, at intervals of one week or one month and performing short circuit defect detection, extremely efficient product management becomes possible.

After short circuit defect detection is performed using the short circuit detection region formed over almost the entire surface of the semiconductor substrate, a new short circuit detection region can be formed while being stacked on the short circuit detection region whose short circuit detection is already completed without the semiconductor substrate being discarded, and subjected again to short circuit defect detection. As just described, by reusing the semiconductor substrate, plural times of short circuit defect detection can be made with one semiconductor substrate without using another silicon semiconductor substrate, which contributes to savings in resource and manufacturing cost.

Specific Embodiments to which the Present Invention is Applied

Embodiments of the present invention will be described in detail below with reference to the drawings.

First Embodiment

In this embodiment, a case where a short circuit detection region is put in one semiconductor chip region of a chip formation region of a silicon semiconductor substrate and short circuit defect detection is performed will be shown as an example.

[Structure of Semiconductor Device Including Short Circuit Detection Region]

Figure 2A:
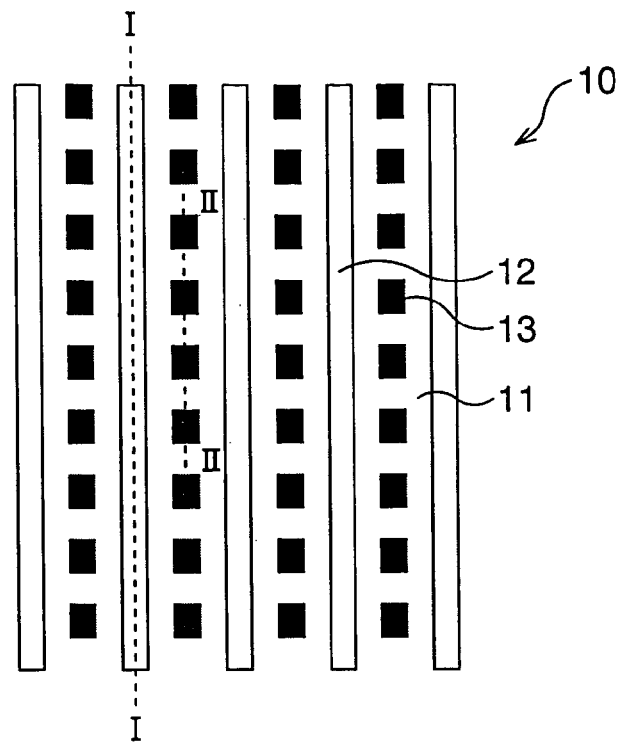
FIG. 2A to FIG. 2C are schematic views showing a schematic structure of a short circuit detection region of the semiconductor device according to the first embodiment.
Figure 2B:
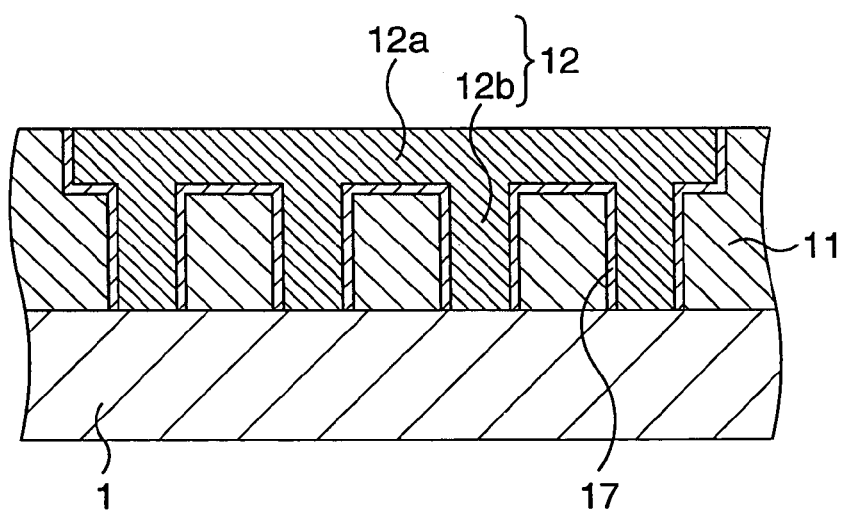
Figure 2C:
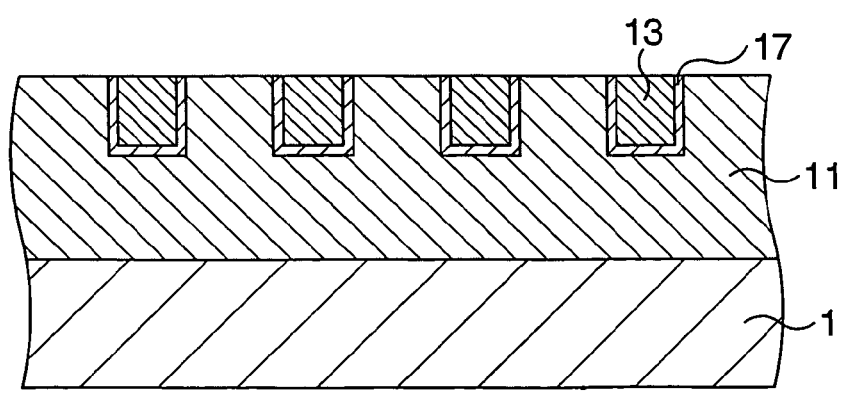

FIG. 1 is a plan view schematically showing a main constituent portion of a semiconductor device according to the first embodiment. FIG. 2A to FIG. 2C are schematic views showing a schematic structure of the short circuit detection region, FIG. 2A is a plan view, FIG. 2B is a sectional view taken along the broken line I-I, and FIG. 2C is a sectional view taken along the broken line II-II.

The semiconductor device according to this embodiment is constructed by forming a short circuit detection region 10 together with plural semiconductor chip regions 2 formed on the surface of a silicon semiconductor substrate 1. In the example shown, the short circuit detection region 10 is formed in one of 4×6 so-called multichips. The short circuit detection region 10 and the respective semiconductor chips 2 except the short circuit detection region 10 are partitioned by scribe lines 3 and demarcated on the surface of the silicon semiconductor substrate 1.

The semiconductor chip regions 2 are regions on which, for example, MOS transistors, various kinds of semiconductor memories, and the like are mounted and which become individual chips by being cut along the scribe lines 3.

As shown in FIG. 2A to FIG. 2C, the short circuit detection region 10 includes an insulating film 11 and plural first conductor traces 12 and plural second conductor traces 13 which formed of a conductive material and embedded in the insulating film 11 with only their surfaces being exposed.

The insulating film 11 is formed by applying an insulating material, here SiLK (registered trademark) for example, being a coating-type low dielectric constant insulating material or depositing a silicon oxide or the like by a CVD method, and it is an insulating film of the short circuit detection region 10 and is formed simultaneously with and out of the same material as an interlayer insulating film of each of the semiconductor chip regions 2.

The respective first conductor traces 12 are pattern-formed in a striped pattern so as to be arranged in parallel as shown in FIG. 2A and FIG. 2B, and embedded in the insulating film 11 with a barrier metal film 17 therebetween. The first conductor trace 12 is constructed by integrally forming a band-shaped portion 12a only the surface of which is exposed and plural via portions 12b which are electrically connected to the silicon semiconductor substrate 1. The plural via portions 12b are formed almost evenly throughout the band-shaped portion 12a. In FIG. 2B, for convenience of illustration, only four via portions 12b are shown. In this case, it is desirable to make the distance between the adjacent first conductor traces 12 as short as possible as long as technology and design constraints permit.

The respective conductor traces 13 are formed each in a strip shape, here, in a rectangular shape while being embedded in the insulating film 11 with the barrier metal 17 therebetween. The second conductor traces 13 are formed in parallel between the adjacent first conductor traces 12 and along a longitudinal direction of the first conductor trace 12, and embedded in the insulating film 11 so as to be electrically insulated from the silicon semiconductor substrate 1 (in a floating state). In this case, it is desirable to form the respective second conductor traces 13 as small and as high-density as possible as long as technology and design constraints permit.

[Forming Method of Short Circuit Detection Region]

Now, a forming method of the short circuit detection region 10 will be described.

FIG. 3A and FIGS. 3B-1 and 3B-2, and FIGS. 4A-1 and 4A-2 and FIGS. 4B-1 and 4B-2 are schematic sectional views showing the forming method of the short circuit detection region step by step. Here, FIG. 3A, 3B-1, 4A-1, and 4B-1 correspond to the section taken along the broken line I-I in FIG. 2A, FIG. 3A, FIG. 3B-2, 4A-2, and 4B-2 correspond to the section taken along the broken line II-II in FIG. 2A.

In this embodiment, the insulating film 11 is formed in the short circuit detection region 10 out of the same material as and simultaneously with the interlayer insulating film formed in the semiconductor chip region 2, and short circuit defects of the semiconductor chip region 2 are managed using the short circuit detection region 10. Here, a case where when wirings are formed in the interlayer insulating film of the semiconductor chip region 2 by a so-called dual damascene method, simultaneously the first conductor traces 12 are formed in the insulating film 11 of the short circuit detection region 10 is shown as an example.

Figure 3A:
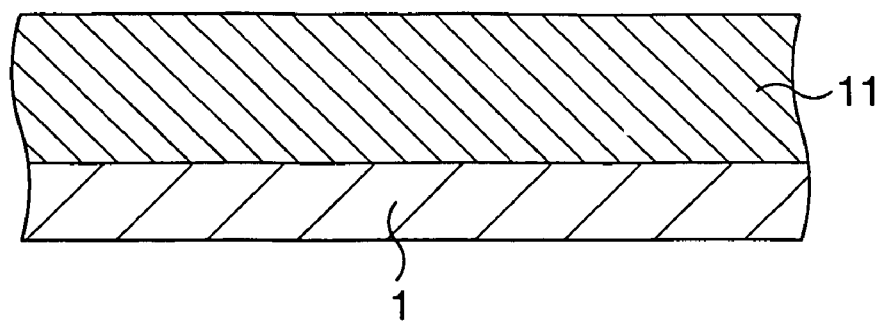

First, as shown in FIG. 3A, after a metal film (not shown) is formed on the silicon semiconductor substrate 1, an insulating material, here, SiLK (registered trademark), for example, being a low dielectric constant insulating material is applied, for example, by a spin coat method or the like and cured to form the insulating film 11. In some cases, the insulating film 11 is formed by depositing a silicon oxide or the like by the CVD method. At this time, in each of the semiconductor chip regions 2, an interlayer insulating film (not shown) is simultaneously formed out of the same material as the insulating film 11. Incidentally, the formation of the metal film on the silicon semiconductor substrate 1 may be omitted.

Figures 1, 3B:
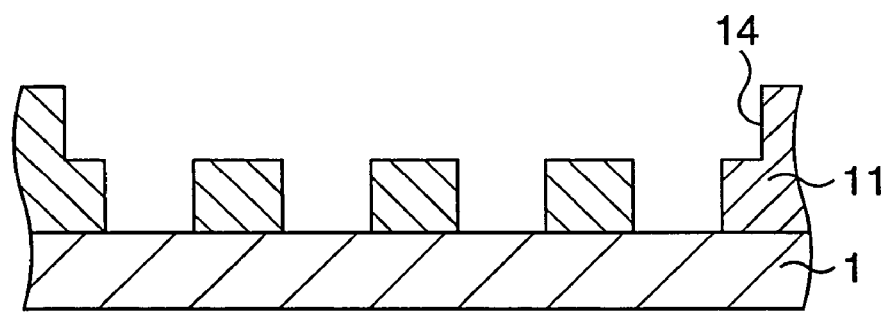
Figures 2, 3B:
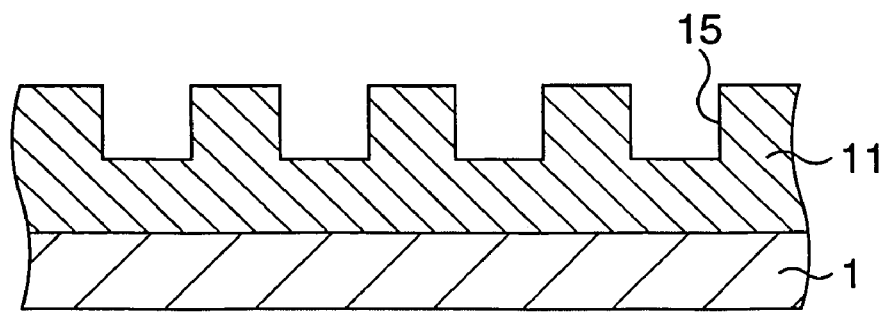

Subsequently, as shown in FIGS. 3B-1 and 3B-2, the insulating film 11 is fabricated by being repeatedly subjected to lithography and dry etching to form first trenches 14 to form the first conductor traces 12 in and second trenches 15 to form the second conductor traces 13 in. Here, together with the first trenches 14 and the second trenches 15, various trenches to form wirings in are simultaneously formed in each of the semiconductor chip regions 2.

As shown in FIG. 3B-1, the first trench 14 is composed of a band-shaped trench 14a which is formed in a stripe shape in the insulating film 11 and via holes 14b which are formed integrally with the band-shaped trench 14a under the band-shaped trench 14a and bored in such a manner that parts of the surface of the metal film (or the surface of the silicon semiconductor substrate 1) are exposed. In the insulating film 11, plural first trenches 14 are formed so as to be arranged in parallel.

As shown in FIG. 3B-2, the second trench 15 is a rectangular trench which is formed in a surface layer portion of the insulating film 11 without the surface of the metal film (or the surface of the silicon semiconductor substrate 1) being exposed. In the insulating film 11, plural second trenches 15 are formed between the adjacent first trenches 14 so as to be arranged in parallel along a longitudinal direction of the first trench 14.

Figures 1, 4A:
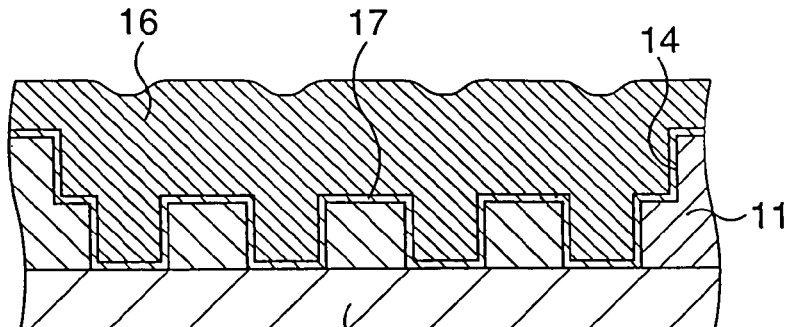
Figures 2, 4A:
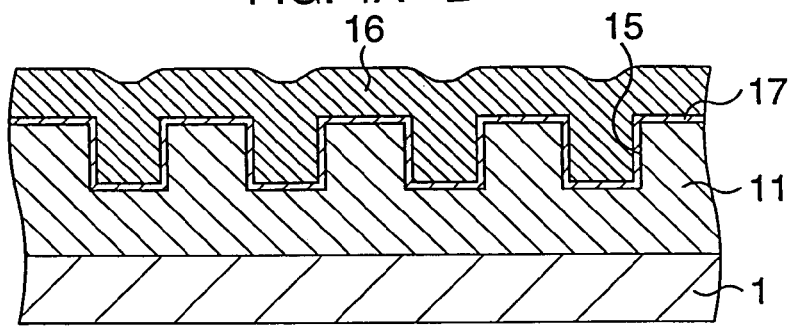

Thereafter, as shown in FIGS. 4A-1 and 4A-2, a conductive material 16 is embedded in the first trench 14 and the second trenches 15. At this time, in each of the semiconductor chip regions 2, the conductive material 15 is simultaneously embedded in the various trenches to form the wirings in. Here, for example, copper (Cu) or its alloy is used as the conductive material 16, and the conductive material 16 is embedded in the first trenches 14 and the second trenches 15 by a so-called damascene method (for the first trenches 14, the dual damascene method).

To be more precise, first, after the barrier metal 17 having low conductivity such as TiN is formed on the insulating film 11 by a sputtering method or the like so as to cover respective inner wall surfaces of the first trenches 14 and the second trenches 15, a plating seed film (not shown) is formed in the same manner so as to cover the respective inner wall surfaces of the first trenches 14 and the second trenches 15 with the barrier metal film 17 therebetween. Incidentally, the formation of the barrier metal film 17 can be omitted in some cases.

Then, the conductive material 16 is grown from the plating seed metal by a plating method, and the conductive material 16 is formed on the insulating film 11 so as to be embedded in the first trenches 14 and the second trenches 15 with the barrier metal film 17 therebetween. FIG. 4A-1 shows a state where the conductive material 16 is embedded in the first trench 14, and FIG. 4A-2 shows a state where the conductive material 15 is embedded in the second trenches 15.

Figures 1, 4B:
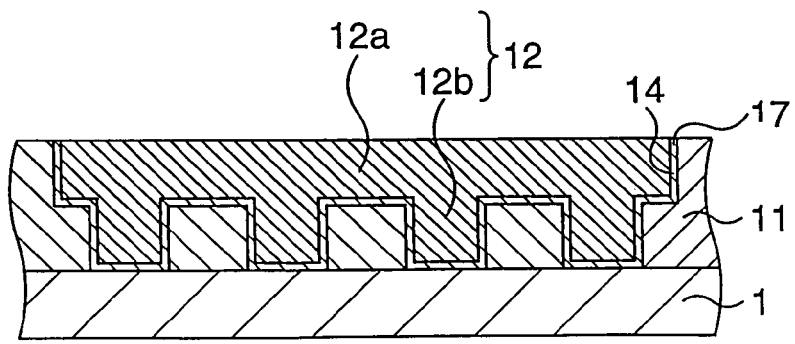
Figures 2, 4B:
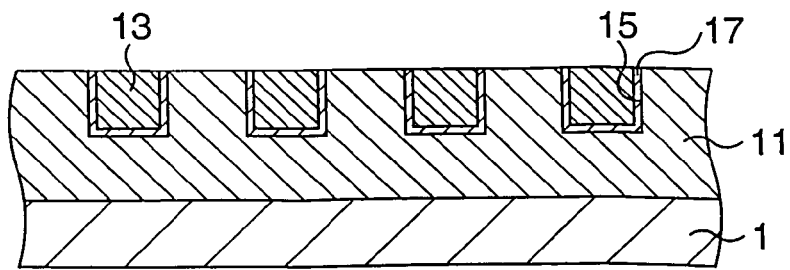

Subsequently, as shown in FIGS. 4B-1 and 4B-2, the conductive material 16 is polished with the insulating film 11 as a polishing stopper by a planarization method, for example, a chemical mechanical polishing method (CMP method), so that the conductive material 16 and the barrier metal film 17 on the insulating film 11 are removed. At this time, the first conductor traces 12 which fill the first trenches 14 and the second conductor traces 13 which fill the second trenches 15 are formed at the same time, and thus the short circuit detection region 10 is completed. FIG. 4B-1 shows a state where the first conductor trace 12 is formed, and FIG. 4B-2 shows a state where the second conductor traces 13 are formed. At this time, each of the semiconductor chip regions 2 is subjected to CMP simultaneously with the first conductor traces 12 and the second conductor traces 13, so that the wirings are formed.

[Short Circuit Defect Detecting Method with Short Circuit Detection Region]

A short circuit defect detecting method with a semiconductor device including the aforementioned short circuit detection region 10 will be described below. In this embodiment, the semiconductor device including the short circuit detection region 10 (that is, the silicon semiconductor substrate 1 on which the short circuit detection region 10, together with the semiconductor chips 2, is formed) and an SEM defect inspector as a defect inspector are used.

Figure 5:
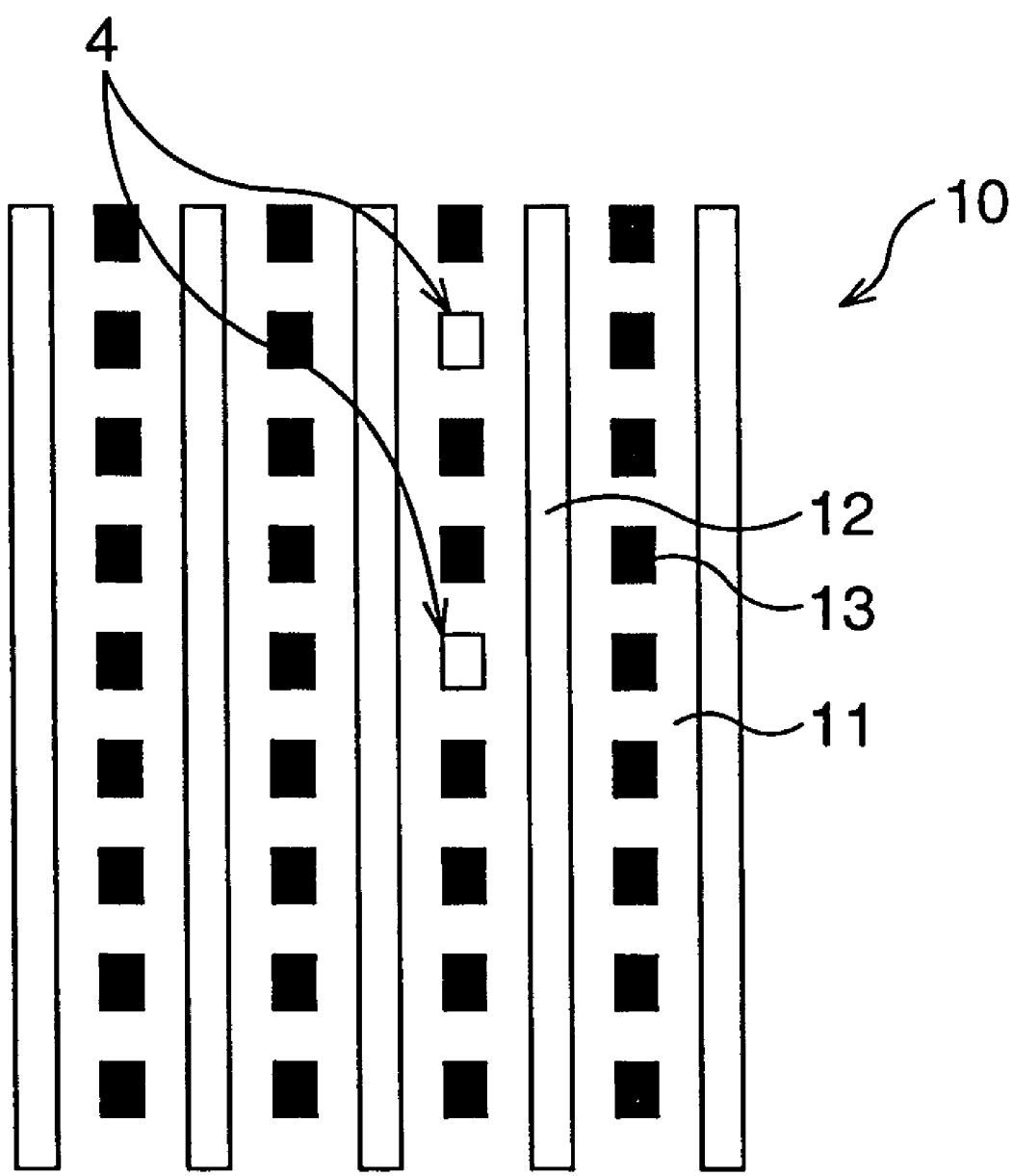
FIG. 5 is a plan view schematically showing a change in potential when a short circuit defect occurs in a predetermined second conductor trace.

FIG. 5 is a plan view schematically showing a change in potential when a short circuit defect occurs in a predetermined second conductor trace, and FIG. 6A to FIG. 6C are plan views showing concrete short circuit states in various short circuit conditions observed by an SEM.

First, the potential of each of the second conductor traces 13 is examined using a defect inspector utilizing a so-called potential contrast method, here, using the SEM defect inspector. In the SEM defect inspector, the difference between light and darkness caused by the potential contrast occurs between the first conductor trace 12 electrically connected to the silicon semiconductor substrate 1 and the second conductor trace 13 in the floating state. Accordingly, if a short circuit occurs between the second conductor trace 13 and the first conductor trace 12, the second conductor trace 13 comes to have the same potential as the first conductor trace 12, and changes from a potential corresponding to the floating state. The second conductor trace 13 which has thus changed is shown as a short circuit trace 4.

Coordinates of the second conductor trace 13 (short circuit trace 4), out of the second conductor traces 13, whose potential has changed from a value corresponding to the floating state are obtained by the SEM defect inspector. As shown in FIG. 5, the second conductor trace 13 whose potential has become the same as that of the first conductor trace 12 is the short circuit trace 4. Since the second conductor trace 13 is small, a short circuit defect can be regarded as existing near the short circuit trace 4.

Then, regarding the short circuit trace 4 near which the short circuit defect is regarded as existing in the manner described above, whether the aforementioned short circuit defect exists on the insulating film 11 or in the insulating film 11 is specified by visual recognition or the like by observation with a microscope, here, with the SEM. In this embodiment, the plural via portions 12b are formed almost evenly throughout the band-shaped portion 12a in the first conductor trace 12, whereby even if a connection failure occurs in part of the plural via portions 12b, the first conductor trace 12 is electrically connected to the silicon semiconductor substrate 1 by the other via portions 12b, and therefore, the probability that the first conductor trace 12 is brought into the floating state due to the connection failure is extremely low. Hence, noise in the detection of short circuit defects in the insulating film 11 is removed as much as possible, and the detection accuracy is high. Accordingly, if no short circuit defect is confirmed by visual recognition or the like using the SEM, the aforementioned short circuit defect can be regarded as existing in the insulating film 11.

In the observation with the SEM, both an SEM condition which makes the potential contrast clear and an SEM condition to acquire a distinct image are used if necessary. However, when the clear-potential contrast and the distinct image can be acquired by one condition, the SEM may be set to the one condition.

Three states shown in FIG. 6A, FIG. 6B, and FIG. 6C are mainly thought of as concrete short circuit states in various short circuit conditions.

The short circuit state in FIG. 6A shows a short circuit caused by a pattern failure when the first conductor traces 12 and the second conductor traces 13 are formed. In this case, the short circuit trace 4 which is the short-circuited second conductor trace 13 is patterned so as to be connected to the first conductor trace 12 (a connecting portion is denoted by numeral 18), so that it can be confirmed by the observation with the SEM. Accordingly, the short circuit defect in this case is regarded as occurring on the insulating film 11.

The short circuit state in FIG. 6B shows a short circuit which causes the short circuit trace 4 due to adhesion of a conductive foreign object 19 in such a manner that the conductive foreign object 19 acts as a bridge between the predetermined second conductor trace 13 and the first conductor trace 12. In this case, the existence of the foreign object 19 can be confirmed by the observation with the SEM. Accordingly, the short circuit in this case is regarded as occurring on the insulating film 11.

The short circuit state in FIG. 6C shows a short circuit when something wrong near the short circuit trace 4 is not confirmed by the observation with the SEM and only the potential of the short circuit trace 4 becomes the same as that of the first conductor trace 12. Accordingly, the short circuit defect in this case can be regarded as occurring in the insulating film 11.

Incidentally, among other short circuit states are a short circuit caused by a so-called scratch and the like, and some causes of the short circuits are conceivable. In any case, by measuring the potentials of the second conductor traces 13 with the SEM defect inspector and observing the second conductor traces 13 whose potentials have changed using the SEM, short circuit defects of the insulating film 11 can be classified into a case where together with the change of the potential, the short circuit defect of the second conductor trace 13 can be confirmed by the observation and a case where only the change of the potential is measured but the short circuit defect of the second conductor trace 13 cannot be confirmed by the observation. Out of these cases, the former case is the short circuit defect on the insulating film 11, and the latter case is the short circuit defect in the insulating film 11.

The number of short circuit defects in the insulating film 11 in the short circuit detection region 10 can be estimated in the manner described above. If the occupation area of the short circuit detection region 10 and the occupation area of the semiconductor chip region 2 are the same, the number of short circuit defects in the interlayer insulating film in each of the semiconductor chip regions 2 can be estimated to be almost the same as the number of short circuit defects in the insulating film 11 in the short circuit detection region 10.

Moreover, for example, it is also possible to estimate the number of short circuit defects in the entire region occupied by the semiconductor chip regions 2 on the semiconductor substrate from the number of short circuit defects detected in the short circuit detection region 10 based on the area ratio between the short circuit detection region 10 and the entire region occupied by the semiconductor chip regions 2. Further, by estimating the area of the insulating film 11 between the second conductor traces 13 and the first conductor trace 12 and using with this area as a standard, the density of short circuit defects in the insulating film 11 can be estimated. By regularly detecting short circuit defects in the short circuit detection region 10 by the aforementioned method, the occurrence of short circuit defects in the insulating film 11 can be monitored, which makes extremely efficient process management possible.

Furthermore, by keeping track of short circuit defects in the insulating film 11, not only the process of the semiconductor device can be managed but also the workmanship of the silicon semiconductor device 1 can be evaluated. The silicon semiconductor device 1 having many short circuit defects or a lot thereof has a high possibility of having low yield. Therefore, by performing feedback control, for example, by inputting a backup lot of the lot, efficient product management becomes possible.

Additionally, in this embodiment, the short circuit detection region is formed in the chip formation region, but it may be formed as a common monitor in a scribe region, for example, outside the chip formation region without changing the design of the chip formation region, or it may be formed in a monitor chip region, resulting in highly reliable product management based on a large amount of data with the wide chip region as its target.

As described above, according to this embodiment, not only short circuit defects observable on the insulating film 11 of the short circuit detection region 10, but also short circuit defects unobservable or hard to observe in the insulating film 11 can be precisely and certainly detected as distinguished from the short circuit defects on the insulating film 11, whereby the semiconductor manufacturing process can be efficiently managed using information on the detected various kinds of short circuit defects.

MODIFIED EXAMPLES

Now, various modified examples of the first embodiment will be described. In these modified examples, the same numerals and symbols will be used to designate the same components as those described in the first embodiment, so that a detailed description thereof will be omitted.

Modified Example 1

This example discloses a semiconductor device structured in the same manner as in the first embodiment and a defect detecting method using the same, but it is different from the first embodiment in that a so-called single damascene method is used in place of the dual damascene method in a forming method of a short circuit detection region.

As in the first embodiment, the short circuit detection region is formed in the insulating film out of the same material as and simultaneously with the interlayer insulating film formed in the semiconductor chip region, and short circuit defects in the semiconductor chip region are managed using the short circuit detection region. This example shows a case where when wirings are formed in the interlayer insulating film of the semiconductor chip region by the so-called single damascene method, the first conductor traces are simultaneously formed also in the insulating film of the short circuit detection region by the single damascene method as an example.

Figure 7:
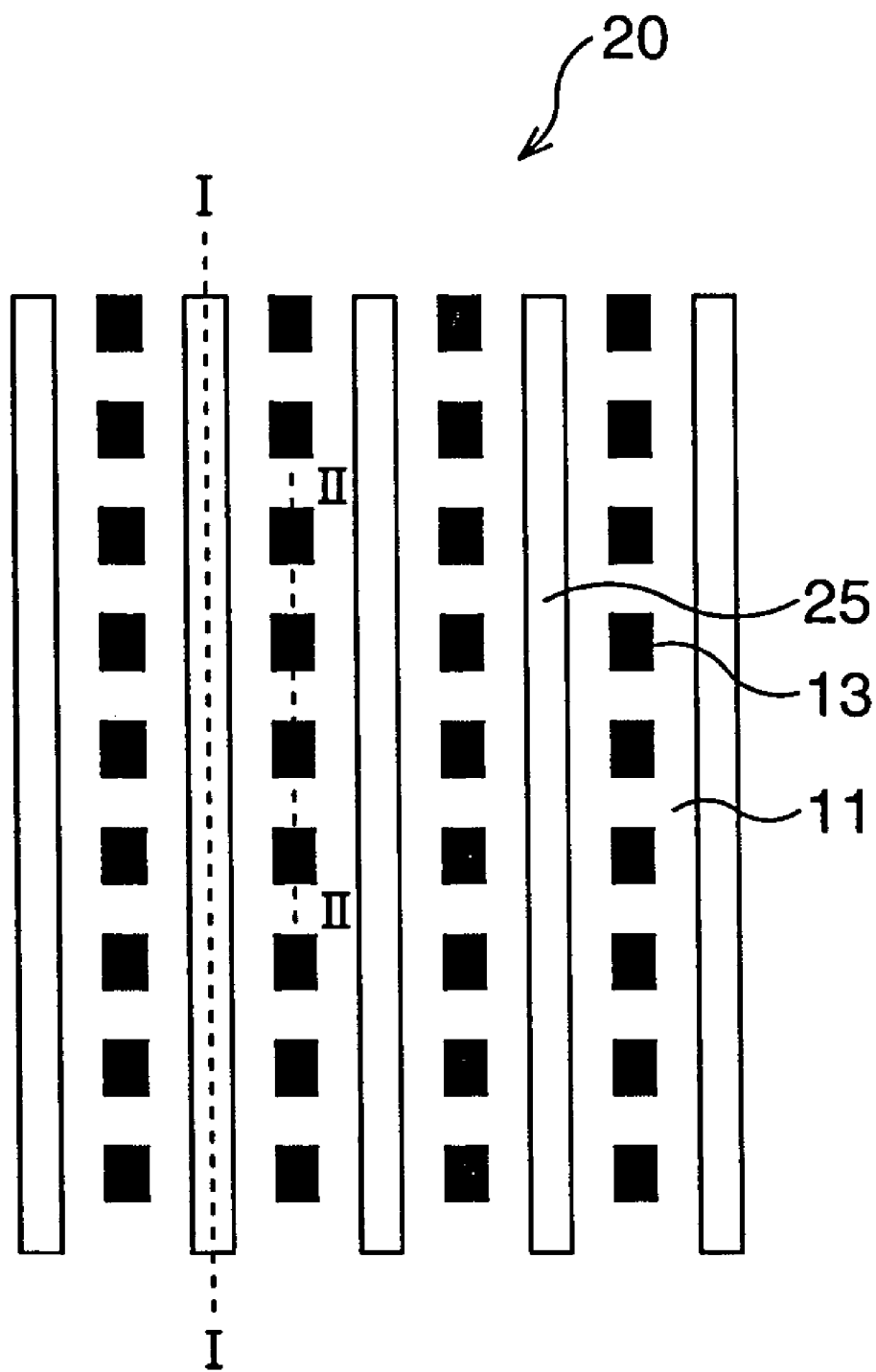
FIG. 7 is a schematic view showing a schematic structure of a short circuit detection region of a semiconductor device according to modified examples of the first embodiment.

FIG. 7 is a plan view showing a schematic structure of the short circuit detection region.

A short circuit detection region 20 includes the insulating film 11, and plural first conductor traces 25 and the plural second conductor traces 13 which are formed of a conductive material and embedded in the insulating film 11 with only their surfaces being exposed.

Here, the respective first conductor traces 25 are pattern-formed so as to be arranged in parallel in a striped pattern and embedded in the insulating film 11. The first conductor trace 25 is constructed by connecting a band-shaped portion 25a which is embedded in the insulating film 11 with the barrier metal film 17 therebetween with only its surface being exposed and plural via portions 21 which are embedded in the insulating film 11 with a barrier metal film 22 therebetween and electrically connected to the silicon semiconductor substrate 1. The plural via portions 21 are formed almost evenly throughout the band-shaped portion 25a. In this case, it is desirable to make the distance between the adjacent first conductor traces 25 as short as possible as long as technology and design constraints permit.

[Forming Method of Short Circuit Detection Region]

A forming method of the short circuit detection region 20 in this example will be described.

FIG. 8A to FIG. 10B-2 are schematic sectional views showing the forming method of the short circuit detection region according to the modified example 1 of the first embodiment step by step. Here, FIG. 8A to FIG. 8D and FIG. 9A correspond to a section taken along the broken line I-I in FIG. 7, FIG. 9B-1, FIG. 10A-1, and FIG. 10B-1 correspond to the section taken along the broken line in FIG. 7, and FIG. 9B-2, FIG. 10A-2, and FIG. 10B-2 correspond to a section taken along the broken line II-II in FIG. 7.

Figure 8A:
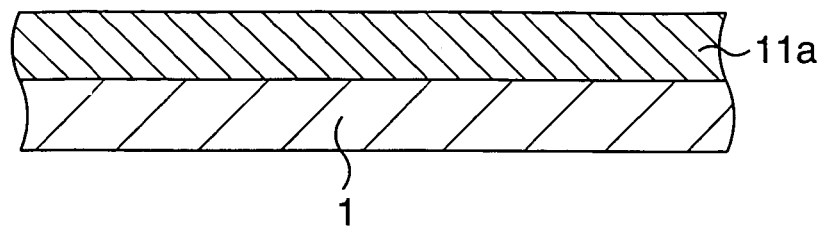
FIG. 8A to FIG. 8D are schematic sectional views showing a forming method of a short circuit detection region according to a modified example 1 of the first embodiment step by step.

First, as shown in FIG. 8A, after a metal film (not shown) is formed on the silicon semiconductor substrate 1, an insulating material, here, SiLK (registered trademark), for example, being a low dielectric constant insulating material is applied by the spin coat method or the like and cured to form an insulating film 11a. In some cases, the insulating film 11a is formed by depositing a silicon oxide or the like by the CVD method. At this time, in each of the semiconductor chip regions 2, an interlayer insulating film (not shown) is simultaneously formed out of the same material as the insulating film 11a. Incidentally, the formation of the metal film on the silicon semiconductor substrate 1 may be omitted.

Figure 8B:
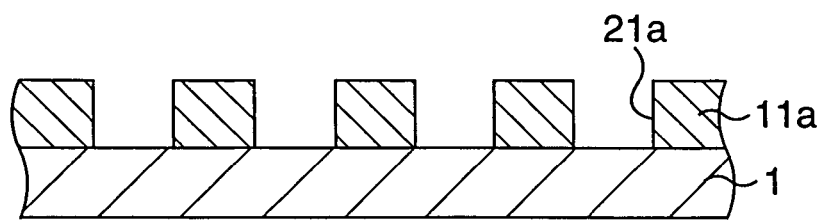

Subsequently, as shown in FIG. 8B, the insulating film 11a is fabricated by being subjected to lithography and dry etching to form via holes 21a to form via portions of the first conductor traces in. Incidentally, together with the via holes 21a, via holes to form wirings in are simultaneously formed in each of the semiconductor chip regions 2.

Figure 8C:
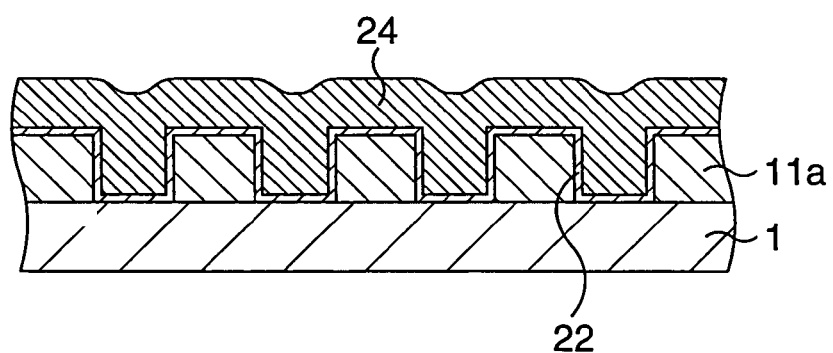

Thereafter, as shown in FIG. 8C, a conductive material 24 is embedded in the via holes 21a. Incidentally, when the wirings and the like are formed in each of the semiconductor chip regions 2, the conductive material 24 is simultaneously embedded in the via holes for the wirings and the like formed in each of the semiconductor chip regions 2.

To put it in detail, after a barrier metal film 22 having low conductivity such as TiN is formed on the insulating film 11a by the sputtering method or the like so as to cover respective inner wall surfaces of the via holes 21a, using tungsten (W), for example, as the conductive material 24, the conductive material 24 is deposited on the insulating film 11a by the CVD method or the like so as to be embedded in the via holes 21a with the barrier metal film 22 therebetween.

Figure 8D:
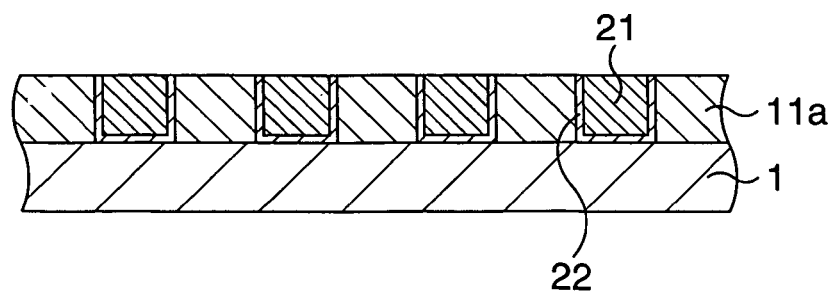

Then, as shown in FIG. 8D, the conductive material 24 is polished with the insulating film 11a as a polishing stopper by a planarization method, for example, the CMP method, so that the conductive material 24 and the barrier metal film 22 on the insulating film 11a are removed. At this time, via portions 21 which fill the via holes 21a are formed. Incidentally, together with the via portions 21, the via portions to form the wirings in each of the semiconductor chip regions 2 are formed in each of the semiconductor chip regions 2.

Figure 9A:
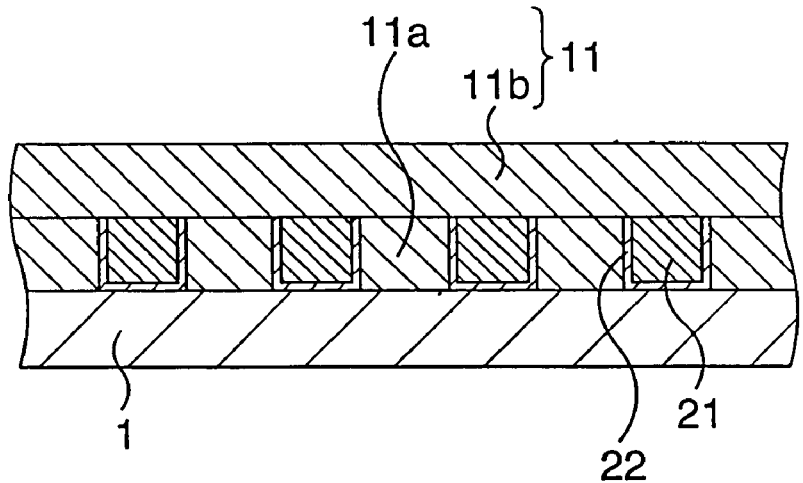

Subsequently, as shown in FIG. 9A, an insulating material, here, SiLK (registered trademark), for example, being a low dielectric constant insulating material is applied by the spin coat method or the like so as to cover the surfaces of the via portions 21 and cured to form an insulating film 11b. In some cases, the insulating film 11b is formed by depositing a silicon oxide or the like by the CVD method. At this time, in each of the semiconductor chip regions 2, an interlayer insulating film (not shown) is simultaneously formed out of the same material as the insulating film 11b.

Figures 1, 9B:
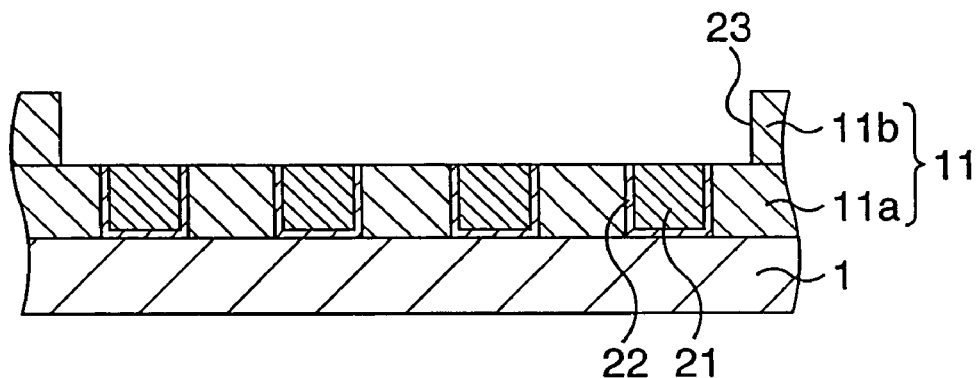
Figures 2, 9B:
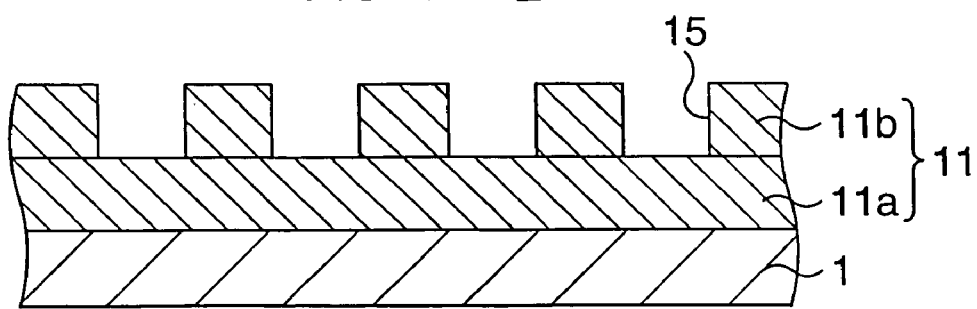

Thereafter, as shown in FIGS. 9B-1 and 9B-2, the insulating film 11b is fabricated by being subjected to lithography and dry etching to form first trenches 23 to form the first conductor traces in with upper surfaces of the via portions 21 being exposed and the second trenches 15 to form the second conductor traces 13 in. Incidentally, together with the first trenches 23 and the second trenches 15, various trenches to form wirings in are simultaneously formed in each of the semiconductor chip regions 2.

As shown in FIG. 9B-1, the first trenches 23, each being a band-shaped trench, are formed in a striped pattern in the insulating film 11b, and the first trench 23 is formed in such a manner that the surfaces of the plural via portions 21 are exposed from the bottom surface thereof. In the insulating film 11b, the plural first trenches 23 are formed so as to be arranged in parallel.

As shown in FIG. 9B-2, the second trench 15 is a rectangular trench which is formed in a surface layer portion of the insulating film 11 without the surface of the metal film (or the surface of the silicon semiconductor substrate 1) being exposed. In the insulating film 11, the plural second trenches 15 are formed between the adjacent first trenches 23 so as to be arranged in parallel along a longitudinal direction of the first trench 23.

Figures 1, 10A:
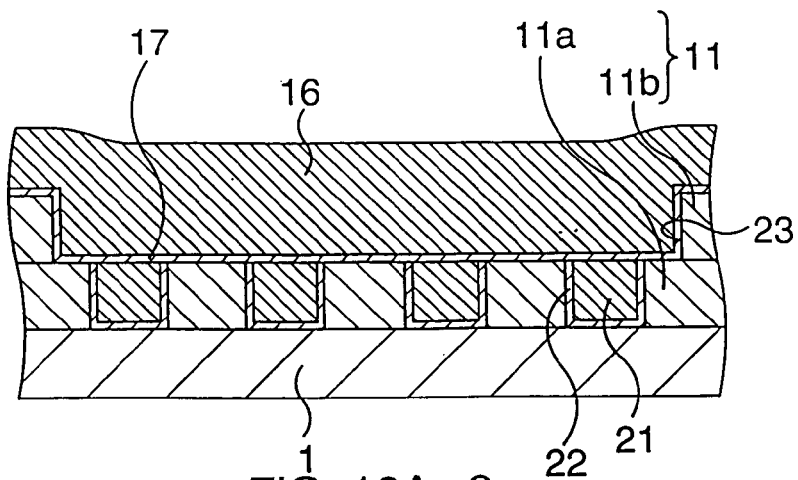
Figures 2, 10A:
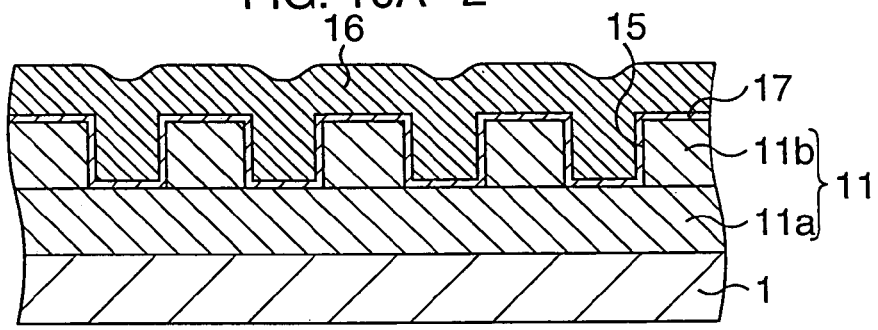

Then, as shown in FIGS. 10A-1 and 10A-2, the conductive material 16 is embedded in the first trenches 23 and the second trenches 15. Incidentally, in each of the semiconductor chip regions 2, the conductive material 16 is simultaneously embedded in the various trenches to form the wirings in. Here, for example, copper (Cu) or its alloy is used as the conductive material 16, and the conductive material 16 is embedded in the first trenches 23 and the second trenches 15 by the so-called damascene method (for the first trenches 23, the dual damascene method).

To be more precise, first, after the barrier metal film 17 having low conductivity such as TiN is formed on the insulating film 11b by the sputtering method or the like so as to cover respective inner wall surfaces of the first trenches 23 and the second trenches 15, a plating seed film (not shown) is formed in the same manner so as to cover the respective inner wall surfaces of the first trenches 23 and the second trenches 15 with the barrier metal film 17 therebetween. Incidentally, the formation of the barrier metal film 17 can be omitted in some cases.

Subsequently, the conductive material 16 is grown from the plating seed metal by the plating method, and the conductive material 16 is formed on the insulating film 11b so as to be embedded in the first trenches 23 and the second trenches 15 with the barrier metal film 17 therebetween. FIG. 10A-1 shows a state where the conductive material 16 is embedded in the first trench 23, and FIG. 10A-2 shows a state where the conductive material 16 is embedded in the second trenches 15.

Figures 1, 10B:
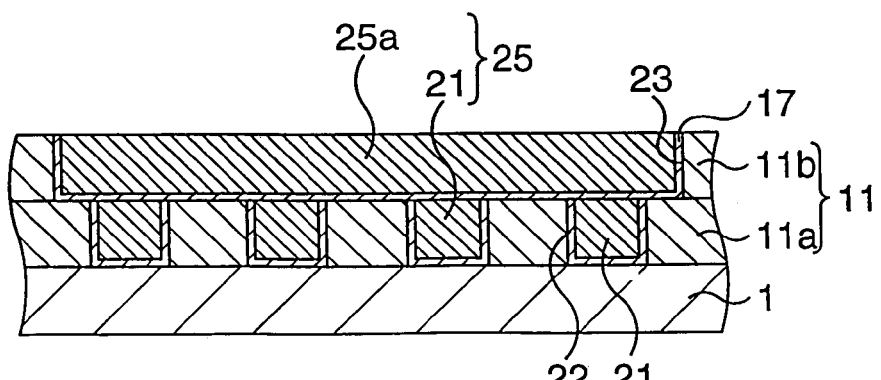
Figures 2, 10B:
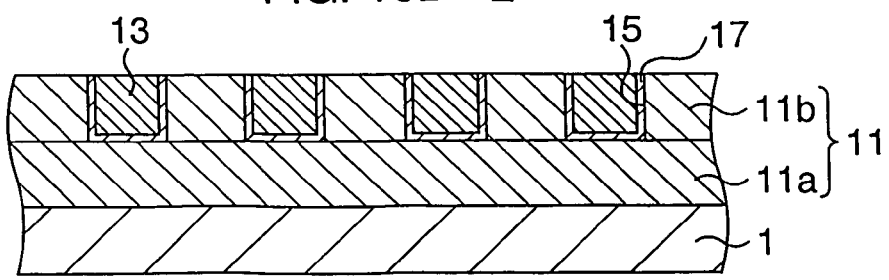

Thereafter, as shown in FIGS. 10B-1 and 10B-2, the conductive material 16 is polished with the insulating film 11 as a polishing stopper by the planarization method, for example, the CMP method, so that the conductive material 16 and the barrier metal film 17 on the insulating film 11b are removed. At this time, the first conductor traces 25 each constructed by integrally forming a band-shaped portion 25a which fills the first trench 23 and the plural via portions 21 and the second conductor traces 13 which fill the second trenches 15 are formed at the same time, and thus the short circuit detection region 20 is completed. FIG. 10B-1 shows a state where the first conductor trace 25 is formed, and FIG. 10B-2 shows a state where the second conductor traces 13 are formed. Incidentally, each of the semiconductor chip regions 2 is subjected to CMP simultaneously with the first conductor traces 25 and the second conductor traces 13, so that the wirings are formed.

[Short Circuit Defect Detecting Method with Short Circuit Detection Region]

A short circuit defect detecting method with a semiconductor device including the aforementioned short circuit detection region 20 will be described below.

A case where a conductive foreign object such as a metal residue exists on the first-layer insulating film 11a when the via portions 21 are formed in the insulating film 11a is considered. At this time, as short circuit defects occurring in the insulating film 11 composed of the insulating films 11a and 11b in the completed short circuit detection region 20, some short circuit defects are caused by a short circuit due to the conductive foreign object on the insulating film 11a, and the other short circuit defects are caused by a short circuit in the insulating film 11b. In this example, data on short circuit defects are managed while these two cases as causes of the short circuit defects in the insulating film 11 are recognized separately. Namely, in this example, three kinds ((1), (2)a), (2)b))

(1) short circuit defects on the insulating film 11 (on the insulating film 11b)

(2) short circuit defects in the insulating film 11
  a) short circuit defects on the insulating film 11a
  b) short circuit defects in the insulating film 11b are detected and data thereon are managed separately.

First, the short circuit defects of (2)a) are detected.

In a state where the via portions 21 are embedded in the insulating film 11a in FIG. 8D, short circuit defects on the insulating film 11a are detected by observation with a microscope, here the SEM, and coordinate data on the detected short circuit defects are stored in a predetermined storage medium or the like.

Then, in a state where the short circuit detection region 20 is completed, the potentials of the second conductor traces 13 are examined using the SEM defect inspector in the same manner as in the first embodiment.

The second conductor trace 13 whose potential becomes the same as that of the first conductor trace 25 gets short-circuited. Since the second conductor trace 13 is small, a short circuit defect can be regarded as existing near the second conductor trace 13 whose potential has changed.

Subsequently, the short circuit defects of (1) and (2)b) are detected, respectively.

First, from the short circuit defects detected using the SEM defect inspector, ones whose coordinate data is near (or coincident with) the aforementioned coordinate data stored in the storage medium or the like (the coordinate data on the short circuit defects detected when the via portions 21 are formed) are excepted. When short circuit defects are detected using the completed short circuit detection region 20 by the detecting method of the first embodiment, the short circuit defect of (2)a) shows the same behavior as the short circuit of (2)b). Accordingly, as described above, by differentiating the short circuit defects of (2)a) out of the short circuit defects detected with the SEM defect inspector, coordinate data on short circuit defects on the insulating film 11b, that is, short circuit defects including (1) and (2)b) can be obtained as the remaining short circuit defects.

Then, regarding each of the second conductor traces 13 of the coordinate data obtained by the aforementioned differentiation, whether the aforementioned short circuit defect exists on the insulating film 11b or exists in the insulating film 11b is specified by visual recognition or the like by the observation with the microscope, here, with the SEM. The former is the short circuit defect of (1), and the latter is the short circuit defect of (2)b). Concrete short circuit states are the same as those in FIG. 6A to FIG. 6C.

As described above, according to the modified example 1, the short circuit defects on the insulating film 11b of the short circuit defect detection region 20, the short circuit defects in the insulating film 11b, and the short circuit defects on the insulating film 11a can be precisely and certainly detected as distinguished from one another, and the semiconductor manufacturing process can be managed efficiently using information on the detected various short circuit defects.

Modified Example 2

This example discloses a semiconductor device structured in the same manner as in the first embodiment and a defect detecting method using the same, but it is different from the first embodiment in that the structure of a short circuit detection region is slightly different.

Figure 11A:
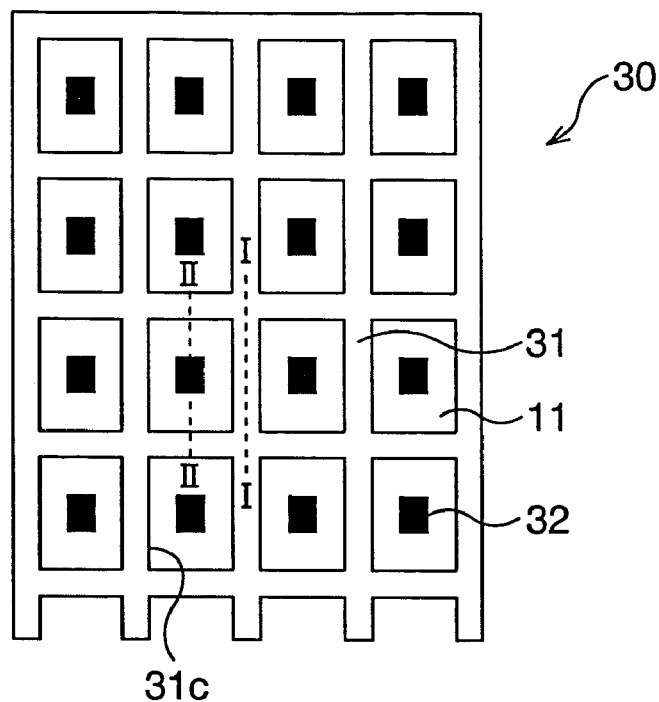
FIG. 11A to FIG. 11C are schematic views showing a schematic structure of a short circuit detection region according to a modified example 2 of the first embodiment.
Figure 11B:
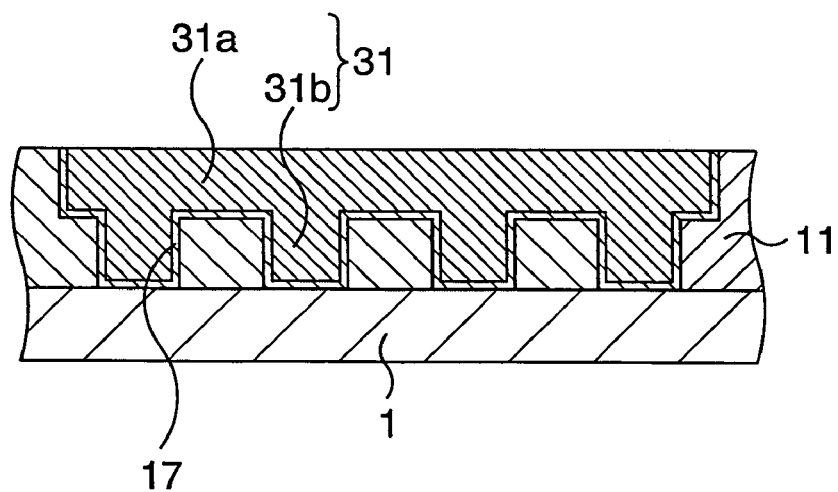
Figure 11C:
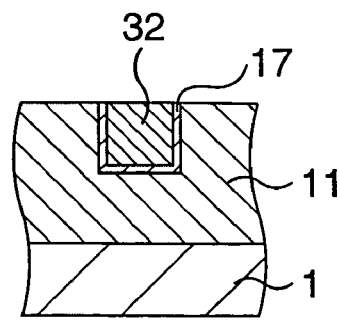

FIG. 11A to FIG. 11C are schematic views showing a schematic structure of the short circuit detection region according to the modified example 2 of the first embodiment, FIG. 11A is a plan view, FIG. 11B is a sectional view taken along the broken line I-I, and FIG. 11C is a sectional view taken along the broken line II-II.

In the semiconductor device of this example, a short circuit detection region 30 includes the insulating film 11, and plural first conductor traces 31 and plural second conductor traces 32 which are formed of a conductive material and embedded in the insulating film 11 with only their surfaces being exposed.

As shown in FIG. 11A and FIG. 11B, the first conductor traces 31 are pattern-formed in a net shape, each being constructed by integrally forming a band-shaped portion 31a embedded in the insulating film 11 in such a manner that only the surface thereof is exposed and plural via portions 31b electrically connected to the silicon semiconductor substrate 1. The plural via portions 31b are formed almost evenly throughout the band-shaped portion 31a, and in the example shown, the first conductor traces 31 have the same potential in arbitrary portions. In this case, it is desirable to form the size of a mesh 31c of the net-shaped first conductor traces 31 as small as possible as long as technology and design constraints permit.

As shown in FIG. 11A and FIG. 11C, each of the second conductor traces 32 is formed in a strip shape, here in a rectangular shape in each of the meshes 31c of the net-shaped conductor traces 31 and embedded in the insulating film 11 so as to be electrically insulated from the silicon semiconductor substrate 1 (in a floating state). In this case, it is desirable to form each of the second conductor traces 32 as small as possible as long as technology and design constraints permit, and it is suitable to form the second conductor traces 32 at high density as well as to form the size of each of the meshes 31c of the net-shaped conductor traces 31 small.

By structuring the short circuit detection region 30 as described above, the number of the via portions 31b which are connecting portions of the first conductor trace 31 with the silicon semiconductor substrate 1 markedly increases, which makes it possible that even if disconnection occurs in two or more portions of the first conductor trace 31 together with a connection failure, the probability of occurrence of which is extremely low, the short circuit defects in the insulating film 11 are detected without detection accuracy being lowered.

Incidentally, a forming method of the short circuit detection region 30 and a short circuit defect detecting method are the same as those in the first embodiment or the modified example 1. The first conductor trace 12 and the second conductor trace 13 in the first embodiment, and the first conductor trace 25 and the second conductor trace 13 in the modified example 1 need to be replaced with the aforementioned first conductor trace 31 and second conductor trace 32, respectively.

As described above, according to the modified example 2, not only short circuit defects observable on the insulating film 11 of the short circuit detection region 30, but also short circuit defects unobservable or hard to observe in the insulating. film 11 can be precisely and certainly detected as distinguished from the short circuit defects on the insulating film 11, whereby the semiconductor manufacturing process can be efficiently managed using information on the detected various short circuit defects.

Modified Example 3

This example discloses a semiconductor device structured in the same manner as in the first embodiment and a defect detecting method using the same, but it is different from the first embodiment in that it copes with multilevel interconnection of the semiconductor chip region.

In the semiconductor chip region, a multilayer wiring structure is sometimes formed by connecting wirings in stacked layers, and in this case, interlayer insulating films need to be formed for respective wiring layers while being stacked. In this example, a case where in order to cope with the respective interlayer insulating films, every time the interlayer insulating film is formed, a new short circuit detection region is formed while being stacked on a short circuit detection region whose short circuit defect detection is already completed, and short circuit defects are estimated for each of the interlayer insulating films is shown as an example.

Figure 12:
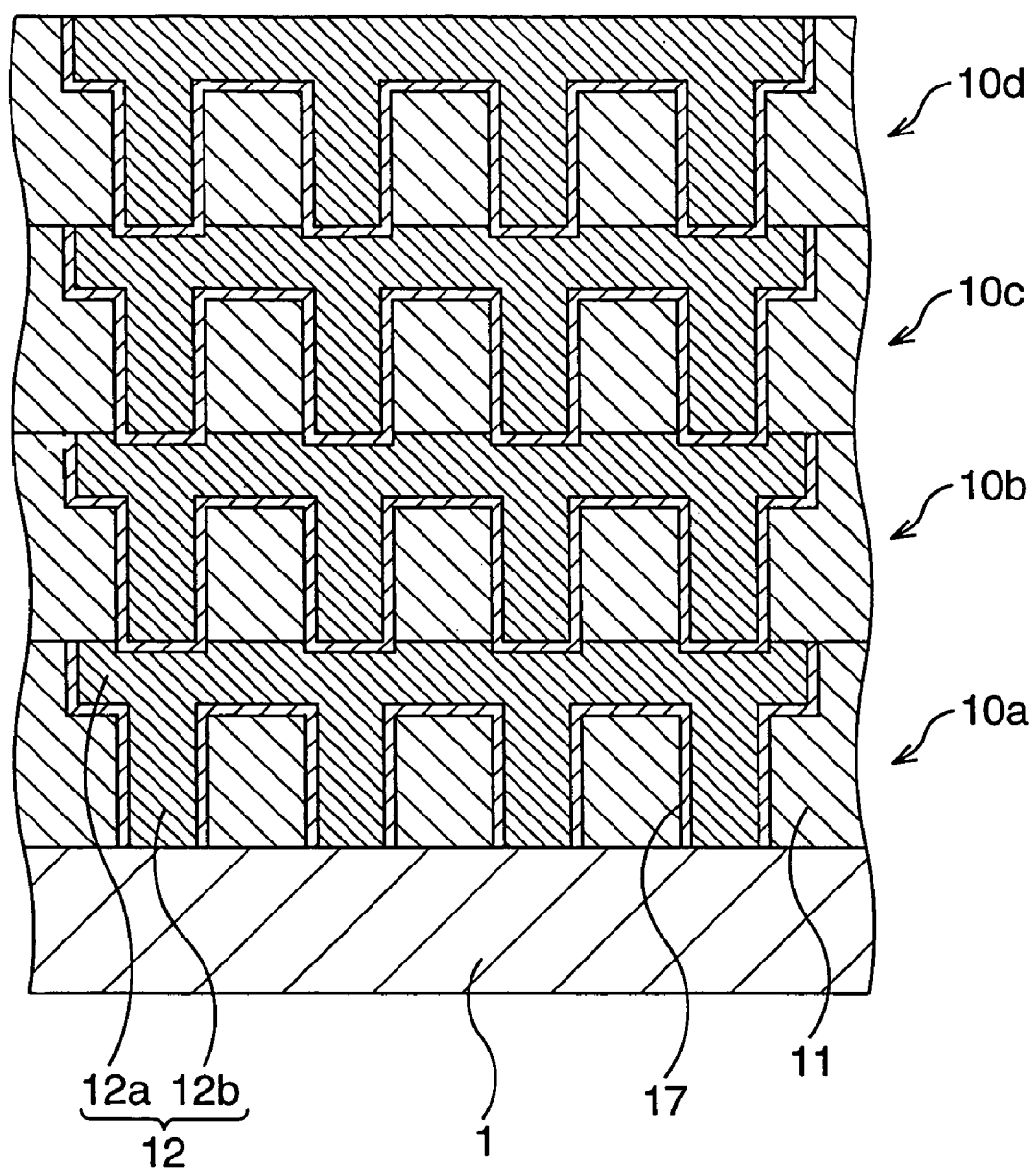
FIG. 12 is a sectional view schematically showing states of short circuit detection regions when short circuit detection is executed according to a modified example 3 of the first embodiment.

FIG. 12 is a sectional view schematically showing the states of short circuit detection regions when short circuit detection is executed according to the modified example 3 of the first embodiment, and corresponds to the section taken along the broken line I-I in FIG. 2A.

First, the short circuit detection region 10, together with an undermost-layer wiring in the semiconductor chip region 2, is formed in the same manner as the forming method of the short circuit detection region described in the first embodiment. This undermost-layer short circuit detection region 10 is taken as 10a for convenience. Using this short circuit detection region 10a, various short circuit defects are detected by the short circuit defect detecting method described in the first embodiment, and using data on these short circuit defects, short circuit defects of the interlayer insulating film in which the undermost-layer wiring of the semiconductor chip region 2 is formed are estimated in the same manner as in the first embodiment.

Then, the short circuit detection region 10, together with a second-layer wiring in the semiconductor chip region 2, is formed in the same manner as the forming method of the short circuit detection region described in the first embodiment. This second-layer short circuit detection region 10 is taken as 10b for convenience. Using this short circuit detection region 10b, various short circuit defects are detected by the short circuit defect detecting method described in the first embodiment, and using data on these short circuit defects, short circuit defects of the interlayer insulating film in which the second-layer wiring of the semiconductor chip region 2 is formed are estimated in the same manner as in the first embodiment.

As just described, the short circuit detection regions 10, together with their corresponding interlayer insulating films, are formed according to the number of stacked layers of the, multilayer wiring of the semiconductor chip region 2, the various short circuit defects are detected as described above, and short circuit defects of the interlayer insulating film concerned are estimated. In the example shown, a case where according to a multilayer wiring having a four-layer structure, the short circuit detection regions 10 (short circuit detection regions 10a, 10b, 10c, and 10d) in four layers in total are formed while being stacked is shown as an example. Here, when the short circuit detection regions 10a to 10d are stacked respectively, the sizes and formation positions of the first conductor traces 12 and the second conductor traces 13 may be appropriately changed as long as the first conductor traces 12 of each of the short circuit detection regions are electrically connected to the silicon semiconductor substrate 1 and the second conductor traces 13 are in a floating state.

Incidentally, in this example, it is suitable to form the respective short circuit detection regions 10 (the short circuit detection regions 10a to 10d in the example shown) using the modified example 1 or 2 instead of using the first embodiment and detect short circuit defects. When the modified example 1 is used, each of the short circuit detection regions 10 needs to be replaced with the short circuit detection region 20, and when the modified example 2 is used, each of the short circuit detection regions 10 needs to be replaced with the short circuit detection region 30.

As described above, according to the modified example 3, depending on the number of stacked layers of the multilayer wiring formed in the semiconductor chip region 2, the short circuit detection regions 10 are formed corresponding to the respective layers, and not only short circuit defects observable on the insulating film 11 in each of the short circuit detection regions 10, but also short circuit defects unobservable or hard to observe in the insulating film 11 can be precisely and certainly detected as distinguished from the short circuit defects on the insulating film 11, whereby the semiconductor manufacturing process can be efficiently managed using information on the detected various short circuit defects.

Second Embodiment

This embodiment shows a case where almost the entire surface of the silicon semiconductor substrate is used as the short circuit detection region and short circuit detection is performed as an example. Here, the same numerals and symbols will be used to designate the same components as those described in the first embodiment, so that a detailed description thereof will be omitted.

Figure 13:
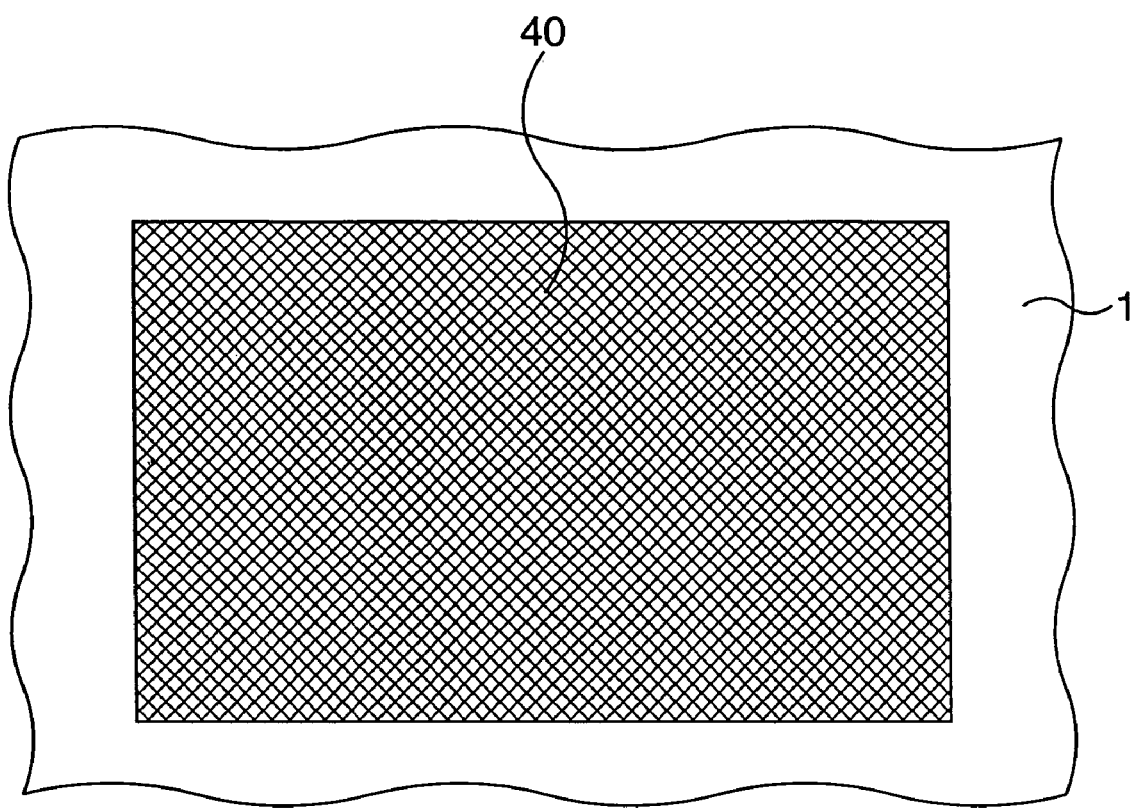
FIG. 13 is a plan view schematically showing a main constituent portion of a semiconductor device according to a second embodiment.

FIG. 13 is a plan view schematically showing a main constituent portion of a semiconductor device according to the second embodiment.

In the semiconductor device according to this embodiment, a short circuit detection region 40 is formed over almost the entire surface of the silicon semiconductor substrate 1. Here, the short circuit detection region 40 is structured in the same manner as the short circuit detection region 10 of the first embodiment and includes the insulating film 11 and the plural first conductor traces 12 and the plural second conductor traces 13 which are formed of the conductive material and embedded in the insulating film 11 with only their surfaces being exposed.

The short circuit detection region 40 is formed in the same manner as the forming method of the short circuit detection region 10 described in the first embodiment. However, the semiconductor device of this embodiment includes no semiconductor chip region, so that only the short circuit detection region 40 is formed on the silicon semiconductor substrate 1 by the forming method of the first embodiment.

In this embodiment, regarding the short circuit detection region 40, short circuit defects on the insulating film 11 and in the insulating film 11 are detected by the detecting method of short circuit defects in the short circuit detection region 10 described in the first embodiment. The detection result of short circuit defects can be used for the process management. Namely, by detecting short circuit defects of the insulating film 11 on the silicon semiconductor substrate 1, short circuit defects of the insulating film 11 in the silicon semiconductor substrate 1 before and after this silicon semiconductor substrate or in a lot including this silicon semiconductor substrate can be estimated. By forming such a silicon semiconductor substrate 1 at predetermined intervals, for example, at intervals of one week or one month and detecting short circuit defects, extremely efficient product management becomes possible.

Incidentally, in this embodiment, it is also suitable that, instead of using the structure and the forming method of the short circuit detection region 10 of the first embodiment for the short circuit detection region 40, using those of the modified examples 1 and 2 of the first embodiment, each of the short circuit detection regions 40 be formed and short circuit defects be detected. When the modified example 1 is used, the short circuit detection region 20 needs to be used for the structure of each of the short circuit detection regions 40, and when the modified example 2 is used, the short circuit detection region 30 needs to be used for the structure of each of the short circuit detection regions 40.

As described above, according to this embodiment, not only short circuit defects observable on the insulating film 11 in the short circuit detection region 40, but also short circuit defects unobservable or hard to observe in the insulating film 11 can be precisely and certainly detected as distinguished from the short circuit defects on the insulating film 11, whereby the semiconductor manufacturing process can be efficiently managed using information on the detected various short circuit defects.

Modified Example

Now, an modified example of the second embodiment will be described. This example discloses a semiconductor device structured in the same manner as in the first embodiment and a defect detecting method using the same, but it is different from the second embodiment in that the semiconductor device is repeatedly subjected to short circuit defect detection.

Figure 14:
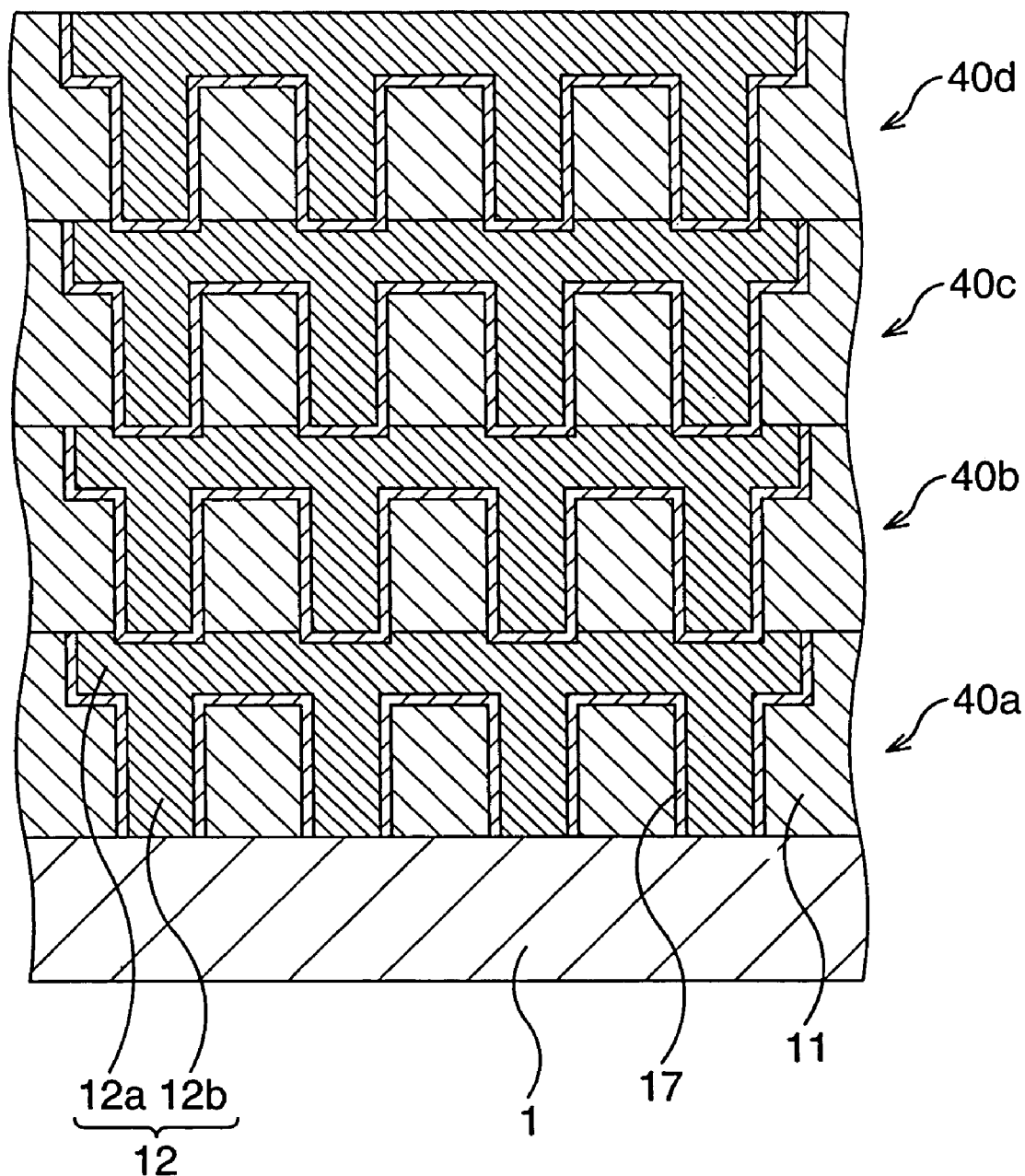
FIG. 14 is a sectional view schematically showing states of short circuit detection regions when short circuit detection is executed according to a modified example of the second embodiment.

FIG. 14 is a sectional view schematically showing the states of short circuit detection regions when short circuit detection is executed according to the modified example of the second embodiment, and corresponds to the section taken along the broken line I-I in FIG. 2A.

After short circuit defect detection is performed using the short circuit detection region 40, the new short circuit detection region 40 is formed while being stacked on the short circuit detection region 40 whose short circuit detection is already completed without the silicon semiconductor substrate 1 being discarded, and subjected again to short circuit defect detection. In the example shown, a case where short circuit defect detection is performed four times using the silicon semiconductor substrate 1 is shown, and a case where the short circuit detection regions 40 (short circuit detection regions 40a, 40b, 40c, and 40d) in four layers in total are stacked is shown as an example. Here, when the short circuit detection regions 40a to 40d are stacked respectively, the sizes and formation positions of the first conductor traces 12 and the second conductor traces 13 may be appropriately changed as long as the first conductor traces 12 of each of the short circuit detection regions are electrically connected to the silicon semiconductor substrate 1 and the second conductor traces 13 are in a floating state.

As just described, by reusing the silicon semiconductor substrate 1, plural times of short circuit defect detection can be made with one silicon semiconductor substrate 1 without using another silicon semiconductor substrate 1, which contributes to savings in resource and manufacturing cost.

As described above, according to this modified example, not only short circuit defects observable on the insulating film 11 in the short circuit detection region 40, but also short circuit defects unobservable or hard to observe in the insulating film 11 can be precisely and certainly detected as distinguished from the short circuit defects on the insulating film 11, whereby the semiconductor manufacturing process can be efficiently managed using information on the detected various short circuit defects.

According to the present invention, not only short circuit defects observable on the insulating film, but also short circuit defects unobservable or hard to observe in the insulating film can be precisely and certainly detected as distinguished from the short circuit defects on the insulating film, whereby the semiconductor manufacturing process can be efficiently managed using information on the detected various short circuit defects.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a semiconductor substrate; and
   a short circuit detection region provided on said semiconductor substrate to detect a short circuit condition on said semiconductor substrate, wherein
   said short circuit detection region comprises:
   an insulating film formed on said semiconductor substrate;
   a first conductor trace formed of a conductive material and embedded in the insulating film with its upper surface being exposed in such a manner as to be electrically connected to said semiconductor substrate by a plurality of connecting portions; and
   a plurality of second conductor traces formed of the conductive material and embedded in the insulating film with their upper surfaces being exposed in such a manner as to be close to the first conductor trace and electrically insulated from said semiconductor substrate.

2. The semiconductor device according to claim 1, wherein the first conductor trace is formed by forming the plurality of connecting portions almost evenly throughout the first conductor trace.

3. The semiconductor device according to claim 1, wherein the insulating film is formed by applying an insulating material on said semiconductor substrate.

4. The semiconductor device according to claim 1, wherein
   a plurality of the first conductor traces are formed in a striped pattern and arranged in parallel, and
   the plurality of strip-shaped second conductor traces are disposed between the adjacent first conductor traces.

5. The semiconductor device according to claim 1, wherein
   the first conductor traces are formed in a net shape, and
   the second conductor trace is disposed in each of meshes of the net-shaped first conductor traces.

6. The semiconductor device according to claim 1, wherein plural layers of said short circuit detection regions are stacked on said semiconductor substrate.

7. The semiconductor device according to claim 1, wherein said short circuit detection region is locally formed together with a semiconductor element formation region on said semiconductor substrate.

8. The semiconductor device according to claim 1, wherein said short circuit detection region is formed in a scribe region outside a semiconductor element formation region on said semiconductor substrate.

9. The semiconductor device according to claim 1, wherein said short circuit detection region is formed over almost the entire surface of said semiconductor substrate.

10. A short circuit detecting method, comprising the steps of, when a short circuit condition is detected with a short circuit detection region in a state where on a semiconductor substrate, the short circuit detection region including an insulating film, a first conductor trace formed of a conductive material and embedded in the insulating film with its upper surface being exposed in such a manner as to be electrically connected to the semiconductor substrate by a plurality of connecting portions, and a plurality of second conductor traces formed of the conductive material and embedded in the insulating film with their upper surfaces being exposed in such a manner as to be close to the first conductor trace and electrically insulated from the semiconductor substrate is formed:
    measuring potentials of the respective second conductor traces; and
    providing optical images or SEM images of the second conductor traces whose potentials have changed in the short circuit detection region.

11. The short circuit detecting method according to claim 10, wherein the first conductor trace is formed by forming the plurality of connecting portions evenly throughout the first conductor trace.

12. The short circuit detecting method according to claim 10, wherein the insulating film is formed by applying an insulating material on the semiconductor substrate.

13. The short circuit detecting method according to claim 10, wherein
    a plurality of the first conductor traces are formed in a striped pattern and arranged in parallel, and
    the plurality of strip-shaped second conductor traces are disposed between the adjacent first conductor traces.

14. The short circuit detecting method according to claim 10, wherein
    the first conductor traces are formed in a net shape, and
    the second conductor trace is disposed in each of meshes of the net-shaped first conductor traces.

15. The short circuit detecting method according to claim 10, wherein the first conductor trace and the connecting portions are formed by a dual damascene method of filling in a trench, which is constructed by integrally forming a band-shaped trench and connection holes in the insulating film, with the conductive material.

16. The short circuit detecting method according to claim 10, wherein
the insulating film is composed of a first insulating film and a second insulating film, and
the first conductor trace is formed by a single damascene method of forming the second insulating film on the first insulating film in which the connecting portions are embedded and filling in a trench, which is formed in the second insulating film in such a manner that the upper surfaces of the connecting portions are exposed, with the conductive material,
said short circuit detecting method, further comprising the steps of:
before measuring the potentials of the respective second conductor traces, providing optical images or SEM images of the connecting portions in a state where the connecting portions are embedded in the first insulating film with their upper surfaces being exposed, and recording first coordinate data on short circuit defects; and
after measuring the potentials of the respective second conductor traces, in the completed short circuit detection region, excepting, from second coordinate data on the second conductor traces whose potentials have changed, those near the first coordinate data, wherein
the optical images or the SEM images of the second conductive traces corresponding to the second coordinate data from which those near the first coordinate data are excepted are provided.

17. The short circuit detecting method according to claim 10, wherein the short circuit detection region is locally formed together with a semiconductor element formation region on the semiconductor substrate.

18. The short circuit detecting method according to claim 10, wherein the short circuit detection region is formed in a scribe region outside a semiconductor element formation region on the semiconductor substrate.

19. The short circuit detecting method according to claim 17, wherein
after said respective steps are executed and a short circuit condition corresponding to the insulating film formed in the semiconductor element formation region together with the short circuit detection region is detected,
not only the insulating film is formed while being stacked on the semiconductor element formation region, but also the short circuit detection region is newly formed while being stacked on the short circuit detection region, and said respective steps are executed using the new short circuit detection region at least once according to the number of the stacked insulating films on the semiconductor element formation region.

20. The short circuit detecting method according to claim 10, wherein the short circuit detection region is formed over almost the entire surface of the semiconductor substrate.

21. The short circuit detecting method according to claim 20, wherein
in a semiconductor device whose short circuit condition has been detected, the short circuit detection region is newly formed while being stacked on the short circuit detection region, and said respective steps are executed using the new short circuit detection region at least once.

* * * * *